United States Patent
Luo et al.

(10) Patent No.: US 10,734,557 B2
(45) Date of Patent: Aug. 4, 2020

(54) LIGHT-EMITTING DEVICE AND MANUFACTURING METHOD THEREOF

(71) Applicants: LITE-ON OPTO TECHNOLOGY (CHANGZHOU) CO., LTD., Changzhou, Jiangsu (CN); LITE-ON TECHNOLOGY CORPORATION, Taipei (TW)

(72) Inventors: Liangliang Luo, Hunan (CN); Shu-yong Jia, Jiangsu (CN); Wen Lee, Hubei (CN); Ke-qin Guo, Shandong (CN)

(73) Assignees: LITE-ON OPTO TECHNOLOGY (CHANGZHOU) CO., LTD., Changzhou, Jiangsu Province (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 16/232,312

(22) Filed: Dec. 26, 2018

(65) Prior Publication Data

US 2019/0363227 A1    Nov. 28, 2019

(30) Foreign Application Priority Data

May 24, 2018    (CN) .......................... 2018 1 0508040

(51) Int. Cl.
*H01L 33/54* (2010.01)
*H01L 33/50* (2010.01)
(Continued)

(52) U.S. Cl.
CPC ............ *H01L 33/54* (2013.01); *H01L 33/502* (2013.01); *H01L 33/507* (2013.01); *H01L 33/60* (2013.01); *H01L 33/62* (2013.01); *H01L 2933/005* (2013.01); *H01L 2933/0033* (2013.01); *H01L 2933/0041* (2013.01); *H01L 2933/0058* (2013.01); *H01L 2933/0066* (2013.01)

(58) Field of Classification Search
CPC ..... H01L 33/54; H01L 33/502; H01L 33/507; H01L 33/60; H01L 33/62; H01L 2933/0033; H01L 2933/0041; H01L 2933/005; H01L 2933/0058; H01L 2933/0066; H01L 33/00–648; H01L 27/15–156; H01L 2933/00–0091
See application file for complete search history.

(56) References Cited

U.S. PATENT DOCUMENTS

2007/0085103 A1*  4/2007  Nishioka ............... H01L 33/507
                                                       257/99
2015/0049486 A1*  2/2015  Jung ........................ F21V 5/04
                                                      362/260

(Continued)

*Primary Examiner* — Shahed Ahmed
(74) *Attorney, Agent, or Firm* — Li & Cai Intellectual Property (USA) Office

(57) ABSTRACT

A light-emitting device includes a package structure and a light-emitting chip. The package structure has a light exiting surface, a rear surface facing away from the light exiting surface, a groove inward recessed on the rear surface, and an outer surrounding side wall surrounding the groove. The light-emitting chip is disposed in the groove. The width of the package structure gradually decreases from the light exiting surface to the rear surface. The width of the groove gradually increases from inside to outside of the groove.

9 Claims, 14 Drawing Sheets

(51) Int. Cl.
*H01L 33/60* (2010.01)
*H01L 33/62* (2010.01)

(56) References Cited

U.S. PATENT DOCUMENTS

2016/0190413 A1* 6/2016 Abe .................. H01L 33/52
 257/99
2019/0207062 A1* 7/2019 Kim .................. H01L 33/486

* cited by examiner

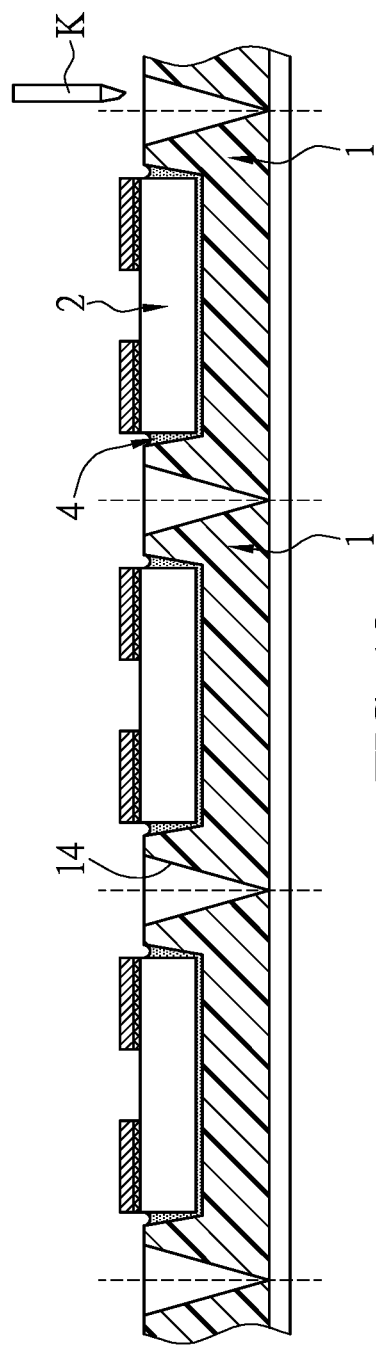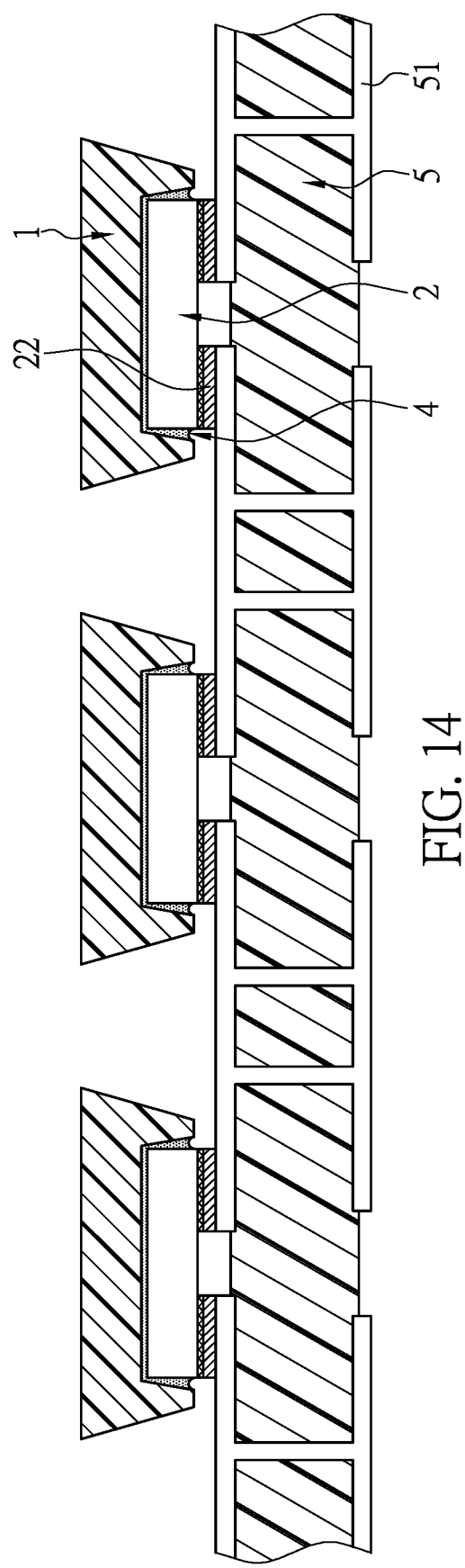

LIGHT-EMITTING DEVICE AND MANUFACTURING METHOD THEREOF

CROSS-REFERENCE TO RELATED PATENT APPLICATION

This application claims the benefit of priority to Chinese Patent Application No. 201810508040.5, filed on May 24, 2018 with the State Intellectual Property Office of People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the present disclosure described herein. All references cited and discussed in this specification are incorporated herein by reference in their entireties and to the same extent as if each reference was individually incorporated by reference.

FIELD OF THE PRESENT DISCLOSURE

The present disclosure relates to a light-emitting device and a manufacturing method thereof, and more particularly to a light-emitting device with increased light emission efficiency and a manufacturing method thereof.

BACKGROUND OF THE PRESENT DISCLOSURE

Improving the light extraction efficiency of a light-emitting device is a heavily competed research subject in this field.

However, for a light-emitting device including a flip-chip, the light emitted from the lateral side of the chip structure cannot be guided out easily, and therefore the device as a whole has lower light extraction efficiency. Accordingly, to increase the brightness of the device, it is known to adopt a process such as substrate lift-off, for example, laser lift-off (LLO) or surface roughening, or to provide a film having a wavelength conversion function between the lateral side of the chip structure and the reflective structure. However, the above process incurs high manufacturing costs, suffers from the disadvantage that the film has limited heat resistance, and therefore a high power requirement cannot be satisfied. In fact, a film with a wavelength conversion function tends to have a larger light decay when at a high light-emitting density, and thus is not suitable for use in a harsh environment. Furthermore, the brightness improvement of a light-emitting device adopting the above means is still limited.

SUMMARY OF THE PRESENT DISCLOSURE

In response to the above-referenced technical inadequacies, the present disclosure provides a light-emitting device and a manufacturing method thereof. The light-emitting device provided by the resent disclosure includes a package structure with a specific structural design, which increases the light extraction efficiency of the light-emitting device and its reliability under high power density.

In one aspect, the present disclosure provides a light-emitting device and a manufacturing method thereof, including a package structure and a light-emitting chip. The package structure has an inward recessed groove for accommodating the light-emitting chip. The width of the package structure gradually decreases from a light exiting surface to a rear surface. The width of the groove gradually increases from inside to outside of the groove.

Therefore, through the technical features of "the width of the package structure gradually decreases from a light exiting surface to a rear surface, and the width of the groove gradually increases from inside to outside of the groove," the light-emitting device can increase the light extraction efficiency of the light-emitting device.

These and other aspects of the present disclosure will become apparent from the following description of certain embodiments taken in conjunction with the following drawings and their captions, although variations and modifications therein may be affected without departing from the spirit and scope of the novel concepts of the present disclosure.

BRIEF DESCRIPTION OF THE DRAWINGS

The present disclosure will become more fully understood from the detailed description and the accompanying drawings, in which:

FIGS. 9-15 are schematic diagrams corresponding respectively to steps S100, S102, S103, S104, S106, S108 and S110 of the manufacturing method for the light-emitting device according to certain embodiments of the present disclosure.

DETAILED DESCRIPTION OF THE EXEMPLARY EMBODIMENTS

Figure 1:
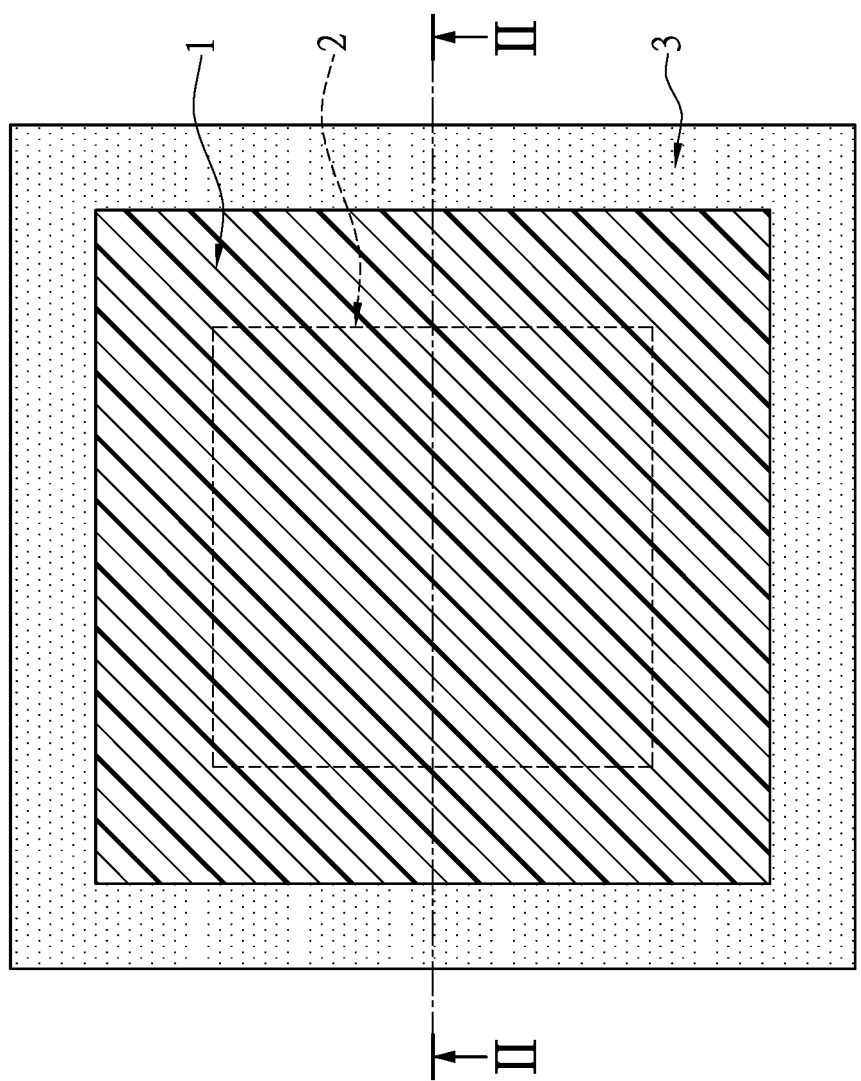
FIG. 1 is a top view of a light-emitting device according to certain embodiments of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
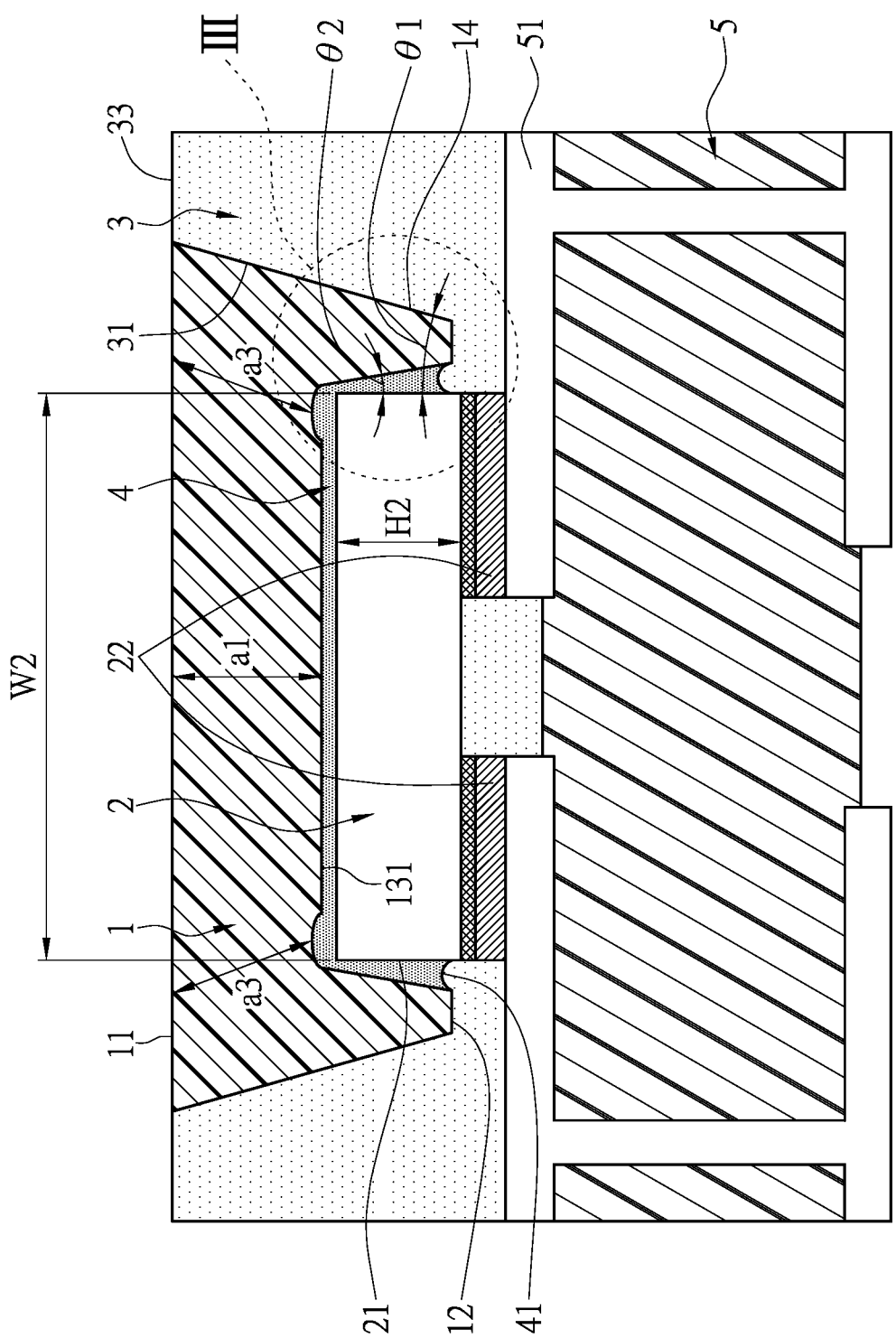
FIG. 2 is a cross-sectional view taken along line II-II of FIG. 1 according to certain embodiments of the present disclosure.
Figure 3:
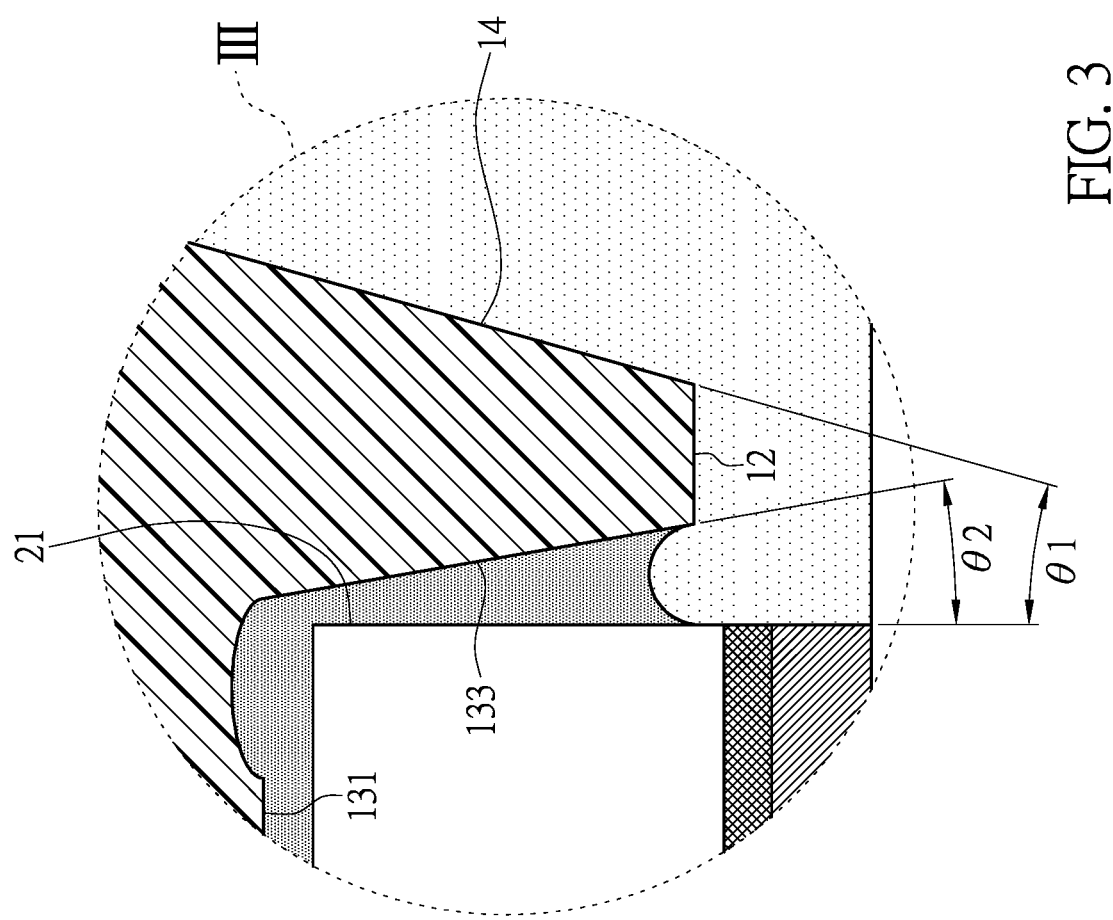
FIG. 3 is a partially enlarged view of a portion III of FIG. 2.
Figure 4:
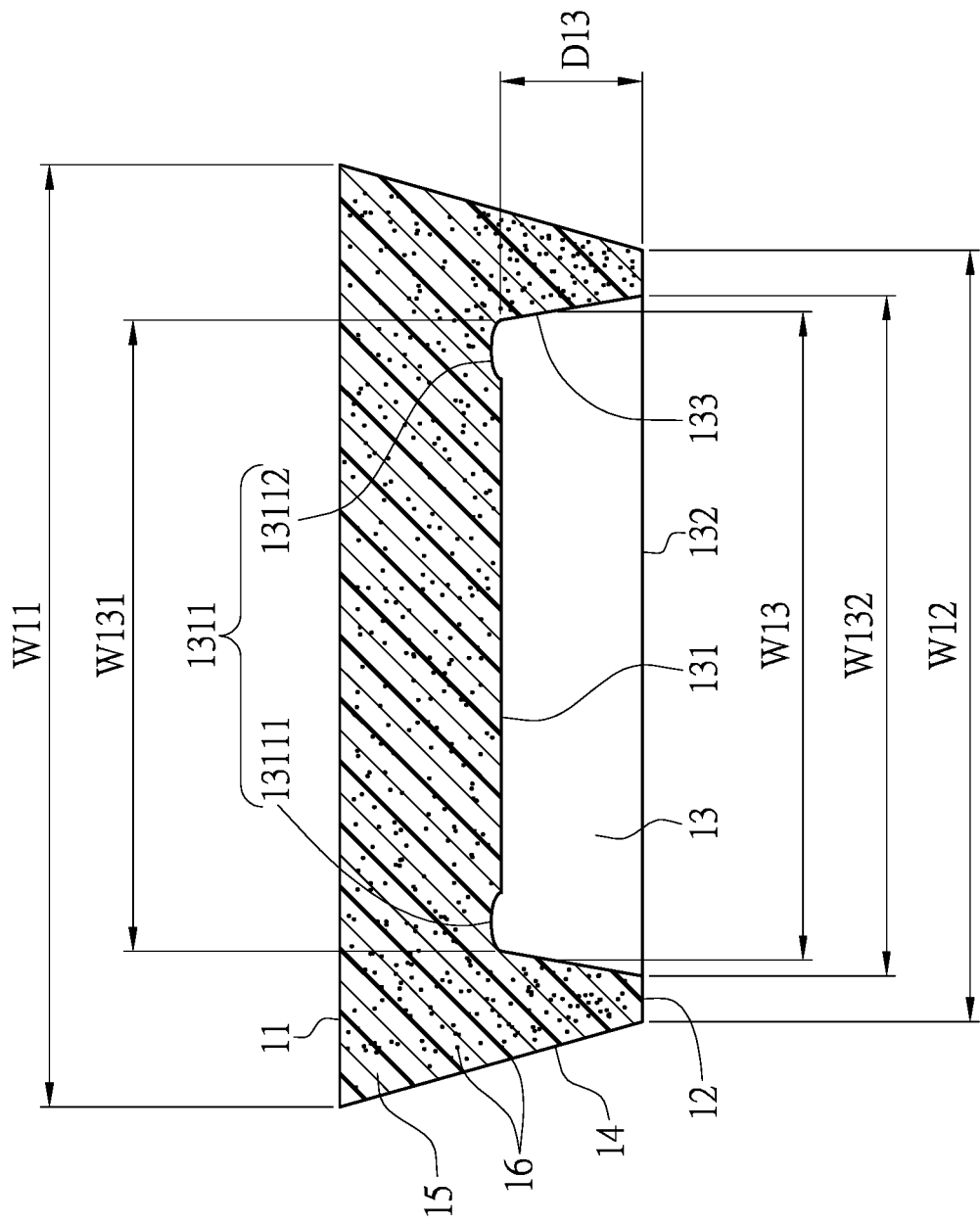
FIG. 4 is a cross-sectional view of a package structure of the light-emitting device according to certain embodiments of the present disclosure.

First, reference is made to FIG. 1 to FIG. 4. FIG. 1 is a top view of a light-emitting device according to certain embodiments of the present disclosure. FIG. 2 is a cross-sectional view taken along line II-II of FIG. 1. FIG. 3 is a partially enlarged view of the portion III of FIG. 2. FIG. 4 is a cross-sectional view of a package structure of the light-emitting device according to certain embodiments of the present disclosure.

As shown in FIGS. 1-4, the light-emitting device D provided by the present disclosure includes a package structure 1 and a light-emitting chip 2. In addition, as shown in FIG. 4, the package structure 1 has a light exiting surface 11, a rear surface 12 facing away from the light exiting surface 11, a groove 13 recessed inwardly from the rear surface 12, and an outer surrounding side wall 14 surrounding the groove 13.

In addition, the rear surface 12 of the package structure 1 can refer to a surface opposite to the light exiting surface 11 (toward the direction away from the light exiting surface 11), that is, the rear surface 12 may be a physical surface. For example, as shown in FIG. 4, the rear surface 12 is a surface between the outer surrounding side wall 14 and an opening 132 of the groove 13, or in certain embodiments, during the manufacturing process of the light-emitting device D, the rear surface 12 may also be recessed almost completely inwardly to the extent of forming the groove 13. In addition, the outer surrounding side wall 14 of the package structure 1 may surround the groove 13 and be connected with both the light exiting surface 11 and the rear surface 12.

Referring to FIGS. 1 and 4, the width of the package structure 1 gradually decreases along a direction from the light exiting surface 11 toward the rear surface 12, and the width W13 of the groove 13 gradually increases from the inside to the outside the groove 13, that is, from the bottom of the groove 13 to the opening 132 of the groove 13. Specifically, the width W11 of the light exiting surface 11 of the package structure 1 is greater than the width W12 of the rear surface 12 of the package structure 1. In other words, the portion of the outer surrounding side wall 14 that is close to the rear surface 12 is inclined toward the center of the opening 132. In addition to the opening 132, the groove 13 further has a bottom surface 131 and an inner surrounding side wall 133 connected between the bottom surface 131 and the opening 132. Further, the groove 13 has a bottom surface width W131 and an opening width W132, and the bottom surface width W131 is smaller than the opening width W132. Therefore, the portion of the inner surrounding side wall 133 close to the rear surface 12 is inclined away from the center of the opening 132. As such, the outer surrounding side wall 14 and the inner surrounding side wall 133 are inclined in opposite directions.

In certain embodiments, the light-emitting chip 2 has a chip width W2, and the bottom surface width W131 of the groove 13 may be 0-200 micrometers greater than the chip width W2 of the light-emitting chip 2. The width W11 of the light exiting surface 11 of the package structure 1 may be 200-600 micrometers greater than the chip width W2 of the light-emitting chip 2. The width W12 of the rear surface 12 of the package structure 1 may be 0-300 micrometers greater than the chip width W2 of the light-emitting chip 2.

In certain embodiments, the bottom surface width W131 of the groove 13 may be between 1,000 micrometers and 1,200 micrometers. The width W11 of the light exiting surface 11 of the package structure 1 may be between 1,200 micrometers and 1,600 micrometers. The width W12 of the rear surface 12 of the package structure 1 may be between 1,000 and 1,200 micrometers. However, the above numerical ranges represent only certain embodiments of the present disclosure, and the actual sizes of the light-emitting device D can be adjusted without departing from the spirit of the present disclosure.

It should be noted that in the present disclosure, as shown in FIG. 4, the package structure 1 may include a package body 15 and a wavelength conversion material 16 dispersed in the package body 15. Therefore, in the present disclosure, the package structure 1 may be a phosphor sheet capable of wavelength conversion. In certain embodiments, the package body 15 contains at least one of light-transmitting ceramics, glass, and quartz. The use of the aforementioned materials as the package body 15 allows the package structure 1 to have better heat resistance. The wavelength converting material 16 can be a phosphor or a core/shell quantum dot. However, in the present disclosure, the detailed types of the package 15 and the wavelength converting material 16 are not limited thereto.

In addition, as shown in FIG. 2, the light-emitting chip 2 is disposed in the groove 13 of the package structure 1. In certain embodiments, the light-emitting chip 2 can be partially or completely disposed within the groove 13 of the package structure 1. In other words, a portion of the light-emitting chip 2 may be located outside of the groove 13 depending on the needs and design of the product. The light-emitting chip 2 may be, for example, a light-emitting diode (LED) or a laser diode (LD), and the wavelength thereof may fall within the range from ultraviolet light to visible light and to infrared light. The light-emitting chip 2 may be a flip chip, for example, a blue flip chip.

As shown in FIG. 2, the light-emitting chip 2 has at least one side surface 21. In general, the light-emitting chip 2 may have four side surfaces 21 and a top surface (not labeled)

connected with the side surface(s) 21, the top surface may be perpendicular to the side surface(s) 21. The top surface of the light-emitting chip 2 may be the main light exiting surface of the light-emitting chip 2, and the side surface(s) 21 may be the secondary light exiting surface(s) of the light-emitting chip 1. In addition, the light-emitting chip 2 also has at least two conductive pads 22 disposed opposite to the light exiting surface 11 (facing away from the top surface) of the package structure 1. The conductive pad 22 can electrically connect the light-emitting chip 2 with other electronic components. The at least two conductive pads 22 are exposed to the outside of the package structure 1.

As described above, the conductive pads 22 according to certain embodiments of the present disclosure may be formed of a solder material, and the solder material may be an alloy such as a gold-tin alloy (AuSn), a tin-silver-copper alloy (SnAgCu), a tin-Silver alloy (SnAg) or tin-bismuth alloy (SnBi).

Next, reference is made to FIG. 2 to FIG. 4. In certain embodiments, the outer surrounding side wall 14 of the package structure 1 is inclined relative to the side surface(s) 21 of the light-emitting chip 2 by a first angle θ1 between 15 degrees and 45 degrees. The inner surrounding side wall 133 of the groove 13 is inclined relative to the side surface(s) 21 of the light-emitting chip 2 by a second angle θ2 between 10 degrees and 30 degrees. In other words, the included angle between the outer surrounding side wall 14 of the package structure 1 and the side surface(s) 21 of the light-emitting chip 2 is between 15 degrees and 45 degrees, and the included angle between the inner surrounding side wall 133 of the groove 13 and the side surface(s) 21 of the light-emitting chip 2 is between 10 degrees and 30 degrees. In certain embodiments, the first angle θ1 is about 30 degrees; and in certain embodiments, the second angle θ2 is about 20 degrees. In certain embodiments, the second angle θ2 can be formed by laser etching.

As described above, the larger the second angle θ2 of the inner surrounding side wall 133 of the groove 13 relative to the side surface(s) 21 of the light-emitting chip 2 is, the higher the brightness of the light-emitting device D is. In certain embodiments, the larger the second angle θ2 is, the higher the brightness is. In certain embodiments, the distance from the opening 132 of the groove 13 to the outer surrounding side wall 14 on the rear surface 12 is about 1.5 micrometers.

Referring again to FIG. 1 and FIG. 2, the light-emitting device D provided by certain embodiments of the present disclosure may further include a reflective structure 3. The reflective structure 3 can be a white wall and can be made of a polymeric material, such as silicone resin. The reflective structure 3 has a reflective surface 31 connected with the outer surrounding side wall 14 of the package structure 1. The light exiting surface 11 of the package structure 1 is exposed outside the reflective surface 31. In addition, in certain embodiments, a top surface 33 of the reflective structure 3 is coplanar with the light exiting surface 11 of the package structure 1.

Specifically, as shown in FIGS. 1 and 4, the reflective structure 3 is located at the periphery of the package structure 1 and the light exiting surface 11 of the package structure 1 is exposed. In certain embodiments, the reflective structure 3 may also cover the rear surface 12 of the package structure 1. In addition, the at least two conductive pads 22 of the light-emitting chip 2 disposed corresponding to the groove 13 of the package structure 1 may also be exposed to the outside of the reflective structure 3.

In addition, as shown in FIGS. 2 and 4, the groove 13 has a bottom surface width W131 (width of the bottom surface 131) and a groove depth D13, and the light-emitting chip 2 has a chip width W2 and a chip height H2. In certain embodiments, the bottom surface width W131 may be 10 micrometer to 60 micrometer larger than the chip width W2, and the groove depth D13 may be equal to the chip height H2 or smaller than the chip height H2 by at most 10 micrometers.

For example, the groove depth D13 may be between 120 micrometers and 160 micrometers. The chip height H2 may be between 130 micrometers and 170 micrometers. The chip width W2 can be between 940 micrometers and 1140 micrometers. As mentioned above, the bottom surface width W131 of the groove 13 can be between 1,000 and 1,200 micrometers. In addition, the distance from the light exiting surface 11 of the package structure 1 to the bottom surface 132 of the groove 13 may be between 140 and 160 micrometers. However, the above numerical ranges are only directed to certain embodiments of the present disclosure, and the present disclosure is not limited thereto.

Specifically, the design of the bottom surface width W131 of the groove 13 and the chip width W2 of the light-emitting chip 2 is advantageous during the manufacturing processes of the light-emitting device D, as alignment difficulty can be reduced, so that the step of disposing the light-emitting chip 2 in the package structure 1 can be conducted smoothly. In addition, the difference between the bottom surface width W131 and the chip width W2 also affects the distance between the light-emitting chip 2 and the inner surrounding side wall 133 of the groove 13, thus affecting the manner in which the light emitted by the light-emitting chip 2 travels.

In addition, as described above, the chip height H2 and the groove depth D13 may be calculated and designed in such a way that a portion of the light-emitting chip 2, such as a portion of the light-emitting chip 2 that is provided with two conductive pads 22 is disposed outside the groove 13. It is to be noted that the term "chip height H2 of the light-emitting chip 2" referred to in certain embodiments of the present disclosure does not include the height of the conductive pad 22 of the light-emitting chip 2. As shown in FIG. 1, a portion of the light-emitting chip 2 and the conductive pad 22 are disposed outside of the groove 13 of the package structure 1 so that the light-emitting chip 2 can be electrically connected to other electronic components through the conductive pad 22.

Next, reference is made to FIGS. 2 and 4. The light-emitting device D provided by certain embodiments of the present disclosure may further include an adhesive material 4 filled or disposed between the light-emitting chip 2 and the package structure 1. Specifically, a portion of the adhesive material 4 is disposed between the side surface(s) 21 of the light-emitting chip 2 and the inner surrounding side wall 133 of the package structure 1, and another portion of the adhesive material 4 may be disposed between the main light exiting surface (not labeled) of the light-emitting chip 2 and the bottom surface 131 of the groove 13 of the package structure 1.

In certain embodiments, the adhesive material 4 is used to fix the light-emitting chip 2 in the groove 13. Therefore, the adhesive material 4 is connected between the light-emitting chip 2 and the package structure 1. In certain embodiments, the adhesive material has a refractive index between 1.39 and 1.57, which is advantageous for reflecting and guiding the light emitted by the light-emitting chip 2 (whether from the side surface(s) 21 or the main light exiting surface) to the light exiting surface 11 of the package structure 1. For example, the adhesive material 4 may be a transparent material such as at least one of silicone resin, epoxy resin, and UV resin.

In addition, as shown in FIGS. 2 and 4, a portion of the adhesive material 4 that is disposed between the side surface(s) 21 of the light-emitting chip 2 and the inner surrounding side wall 133 of the groove 13 of the package structure 1 has a concave surface 41 adjacent to the opening 132 of the groove 13 and recessing along a direction away from the opening 132 (being inwardly recessed). For example, in the manufacturing process of the light-emitting device D, the adhesive material 4 is filled in the groove 13 and then the light-emitting chip 2 is placed in the groove 13 filled with the adhesive material 4. Therefore, limited by the characteristics of the adhesive material 4 (for example, surface tension), the surface of the adhesive material 4 at the opening 132 of the groove 13 will not be flat, but may be a convex or concave surface.

As described above, the concave surface 41 of the adhesive material 4 formed adjacent to the opening 132 of the groove 13 is advantageous for causing the light emitted by the side surface(s) 21 of the light-emitting chip 2 to be refracted or reflected and therefore be directed toward the inside of the package structure 1. In this way, the structural design of the concave surface 41 can improve the light extraction efficiency of the light-emitting device D.

In certain embodiments, the light emitted from the side surface(s) 21 of the light-emitting chip 2 first passes through the transparent adhesive material 4, is refracted at the boundary between the transparent material 4 and the package structure 1, and enters the inside of the package structure 1. A portion of the light beam that enters the inside of the package structure 1 is projected on the reflective surface 31 of the reflective structure 3, and the reflective surface 31 reflects the light beam projected thereon and guide it to the light exiting surface 11 of the package structure 1. For example, when the light-emitting chip 2 is a blue light chip and the blue light beam emitted therefrom is in the package structure 1, the blue light beam can be converted into a light beam having a wavelength different from the original wavelength by the wavelength conversion material 16 in the package structure 1 and then emitted out through the light exiting surface 11.

Referring again to FIG. 2, the light-emitting device D provided by certain embodiments of the present disclosure further includes a substrate 5. The light-emitting chip 2 is electrically connected to the substrate 5. As shown in FIG. 2, the substrate 5 is electrically connected to the conductive pads 22 of the light-emitting chip 2 through the conductive lines 51 thereon. In this way, the light-emitting chip 2 can be electrically connected to other electronic components through the substrate 5. In certain embodiments of the present disclosure, the substrate 5 may be a direct electroplated copper (DPC) ceramic substrate or a metal core PCB (MCPCB). However, the present disclosure is not limited thereto.

Figure 5:
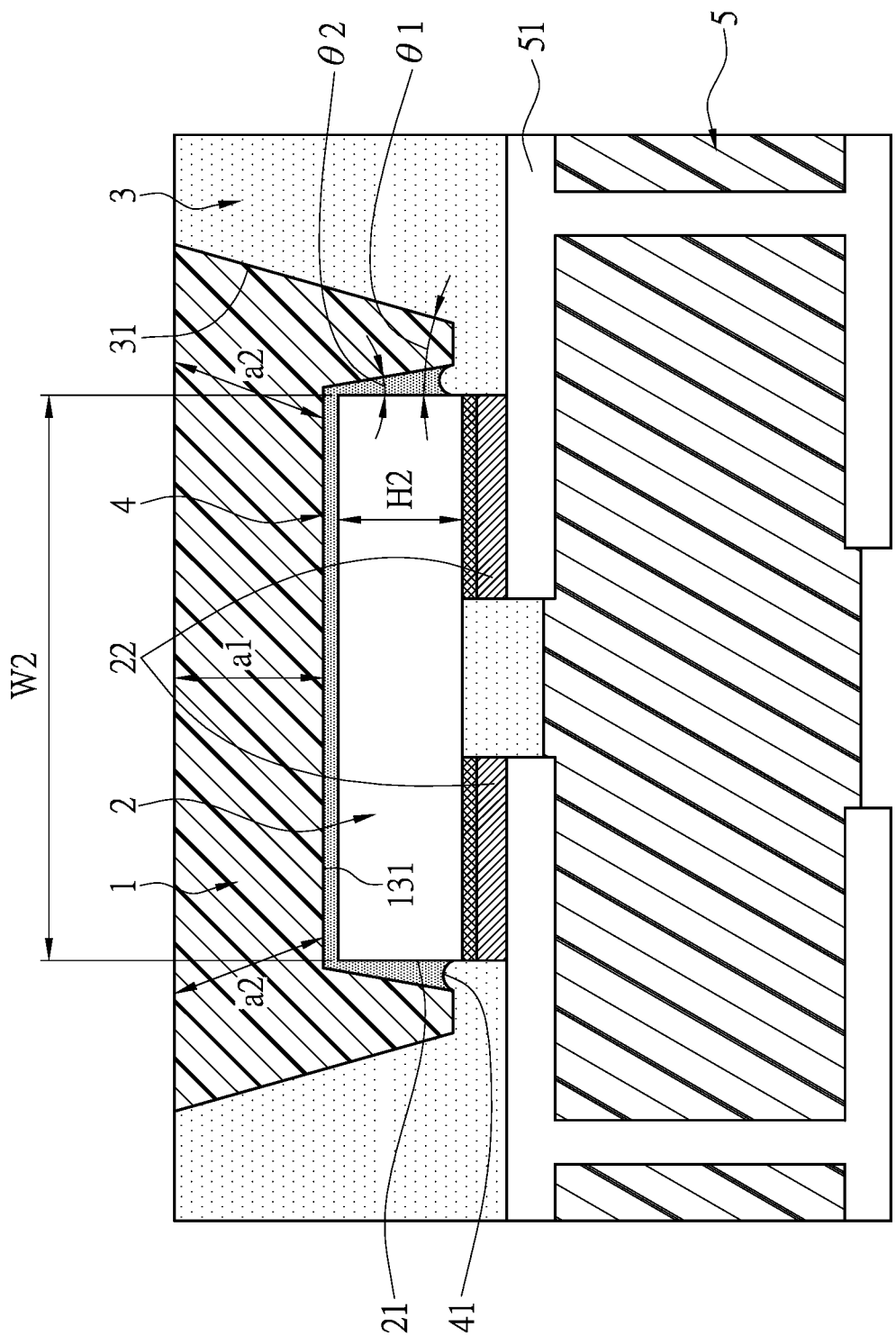
FIG. 5 is a cross-sectional view of the light-emitting device according to certain embodiments of the present disclosure.
Figure 6:
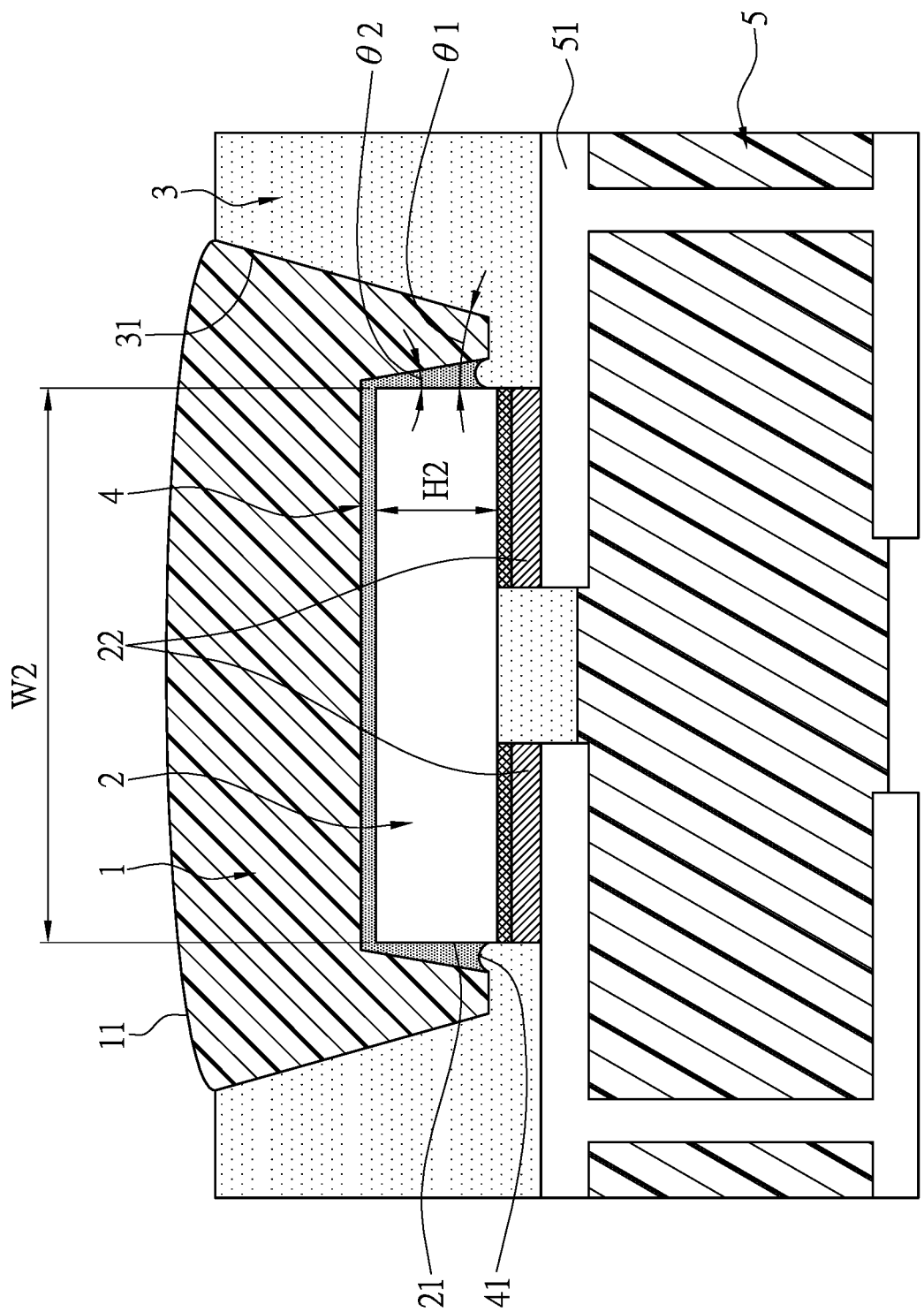
FIG. 6 is a cross-sectional view of the light-emitting device according to certain embodiments of the present disclosure.
Figure 7:
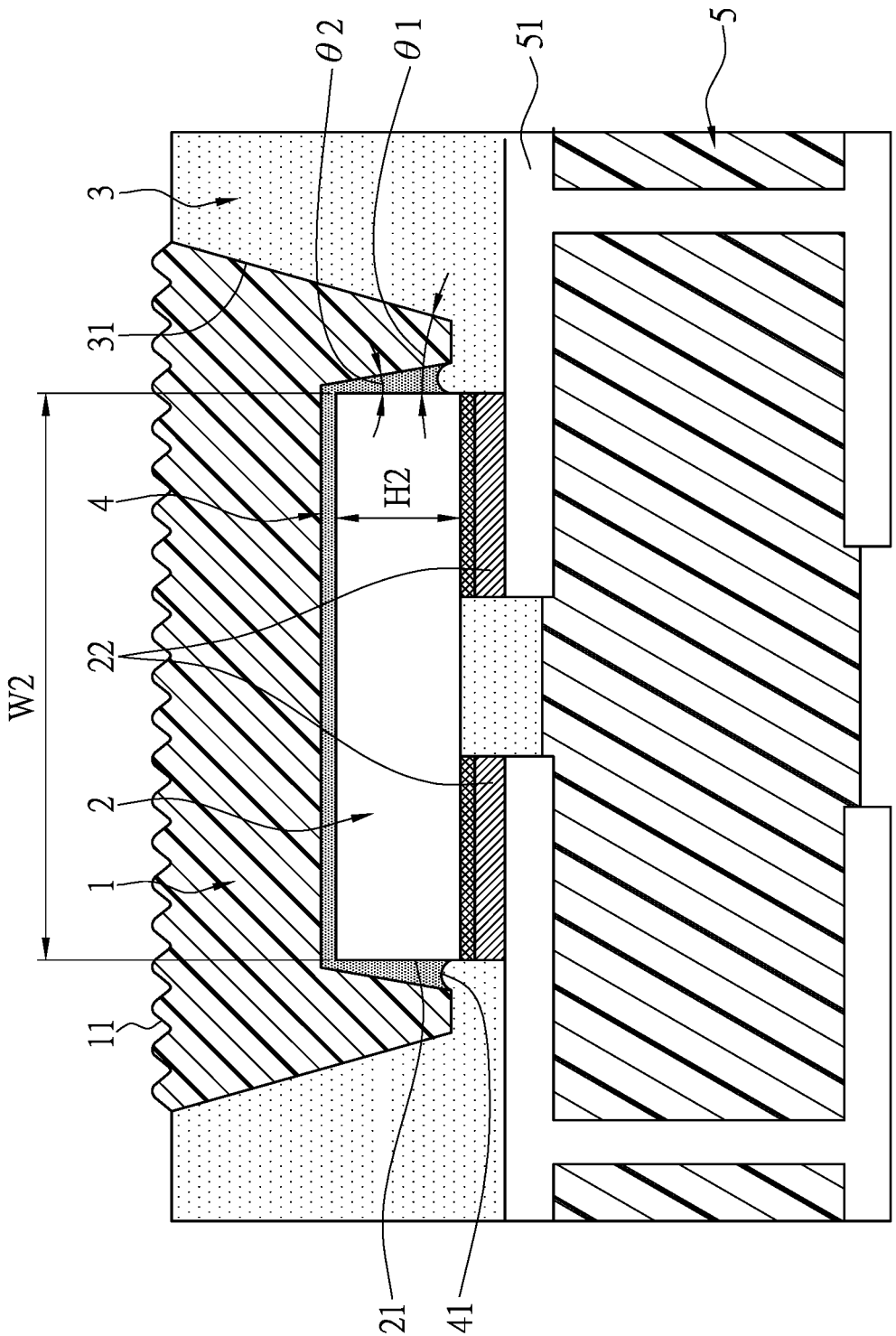
FIG. 7 is a cross-sectional view of the light-emitting device according to certain embodiments of the present disclosure.

Next, reference is made to FIGS. 5-7, which are schematic cross-sectional views of a light-emitting device D according to certain embodiments of the present disclosure. In other words, FIGS. 5-7 show different types of the light-emitting device D provided by certain embodiments of the present disclosure.

First, from the comparison between FIG. 2 and FIG. 5, one of the differences between FIG. 2 and FIG. 5 is the structure of the bottom surface 131 of the groove 13 in the package structure 1. The grooves 13 in FIG. 2 and FIG. 5 are recessed inwardly from the rear surface 12 of the package structure 1. However, in certain embodiments shown in FIGS. 2 and 4, the bottom surface 131 of the groove 13 is further formed with a first side recessed region 13111 and a second side recessed region 13112 which are adjacent to the inner surrounding side wall 133 of the groove 13.

Reference is made to FIGS. 2 and 5. As shown in FIG. 5, when the bottom surface 131 of the groove 13 of the package structure 1 is a flat surface, the difference between the optical paths of the light beams emitted by the light-emitting chip 2 at different angles is more significant. For example, for a light beam emitted from the central part of the light-emitting chip 2, its optical path a1 in the package structure 1 is shorter than an optical path a2 in the package structure 1 of the light beam emitted from the two side parts of the light-emitting chip 2. However, in certain embodiments shown in FIG. 2, due to the package structure 1 disposed under the bottom surface 131 of the groove 13, the thickness of the package structure 1 gradually increases along a direction from near the inner surrounding side wall 133 toward the center of the groove 13, and therefore a length of the optical path a1 in the package structure 1 of the light beam emitted from the central part of the light-emitting chip 2 is close to or the same as the length of the optical path a3 in the package structure 1 of the light beam emitted from the two side parts of the light-emitting chip 2.

As a result, the package structure 1 shown in FIG. 2 can further improve the angular color uniformity (ACU) of the light-emitting chip 2 at different light emission angles.

On the other hand, as in certain embodiments shown in FIG. 5, the bottom surface 131 of the groove 13 does not have the microstructure 1311 including the first side recessed region 13111 and the second side recessed region 13112.

In certain embodiments, the specific structure of the bottom surface 131 of the groove 13 can be changed by adjusting the manufacturing process or according to actual needs, and the present disclosure is not limited thereto. For example, the grooves 13 may be formed by selecting laser devices having different wavelengths, or by lithography, thereby obtaining bottom surfaces 131 having different structures. The microstructure 1311 formed on the bottom surface 131 of the groove 13 may be a zigzag or wavy structure. However, the present disclosure is not limited thereto.

Next, reference is made to FIG. 6 and FIG. 7. Comparing FIG. 6 and FIG. 7 with FIG. 2, one of the differences between FIG. 6 and FIG. 7 and FIG. 2 is the structural design of the light exiting surface 11 of the package structure 1. In certain embodiments shown in FIG. 2, the light exiting surface 11 of the package structure 1 is a plane that is flush with the reflective structure 3, whereas in certain embodiments shown in FIG. 6, the light exiting surface 11 of the package structure 1 has a convex surface protruding along a direction away from the light-emitting chip 2. In certain embodiments shown in FIG. 7, the light emitting surface 11 of the package structure 1 is an irregular surface, such as a rough surface.

For example, when the light exiting surface 11 of the package structure 1 has a convex surface, the light emitted by the light-emitting chip 2 can be more uniformly emitted from the light exiting surface 11 to improve the ACU thereof. Specifically, the design of the convex surface can make the light emitted by the light-emitting chip 2 have the same optical path length, so that the light-emitting device D as a whole has an uniform light-emitting effect at different angles. The light exiting surface 11 having the convex surface can be formed by polishing the light exiting surface 11 of the package structure 1 during manufacturing processes.

Next, as shown in FIG. 7, the light exiting surface 11 of the package structure 1 may also be an irregular surface. For example, the irregular surface can be formed by roughening the light exiting surface 11 of the package structure 1 during a manufacturing process. The design of the irregular surface can reduce the total reflection effect at the light exiting surface 11, thereby improving the brightness of the emitted light of the light-emitting device D.

Figure 8:
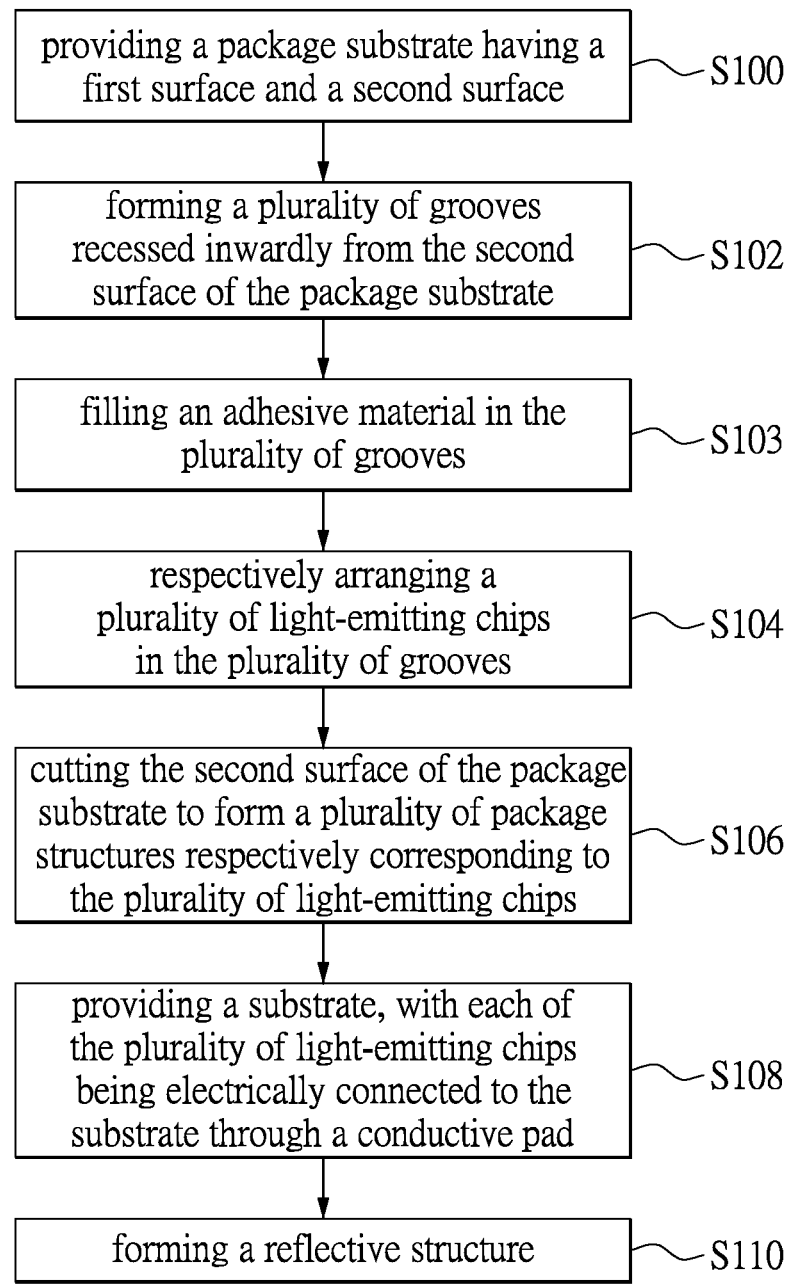
FIG. 8 is a flowchart of a manufacturing method for the light-emitting device according to certain embodiments of the present disclosure.

The present disclosure also provides a manufacturing method that can be used to fabricate the light-emitting device D as described above. Reference is made to FIG. 8, which is a flowchart of a manufacturing method for a light-emitting device D according to certain embodiments of the present disclosure.

Specifically, the manufacturing method provided by the present disclosure includes: providing a package substrate having a first surface and a second surface (step S100); forming a plurality of grooves recessed inwardly from the second surface of the package substrate (step S102); filling the adhesive material in the plurality of grooves (step S103); respectively arranging a plurality of light-emitting chips in the plurality of grooves (step S104); cutting the second surface of the package substrate to form a plurality of package structures respectively corresponding to the plurality of light-emitting chips (step S106); providing a substrate, with each of the plurality of light-emitting chips being electrically connected to the substrate through a conductive pad (step S108); and forming a reflective structure (step S110).

Reference is made to FIG. 9 to FIG. 15, which are schematic diagrams respectively showing different steps in a method of manufacturing a light-emitting device D according to the present disclosure.

Figure 9:
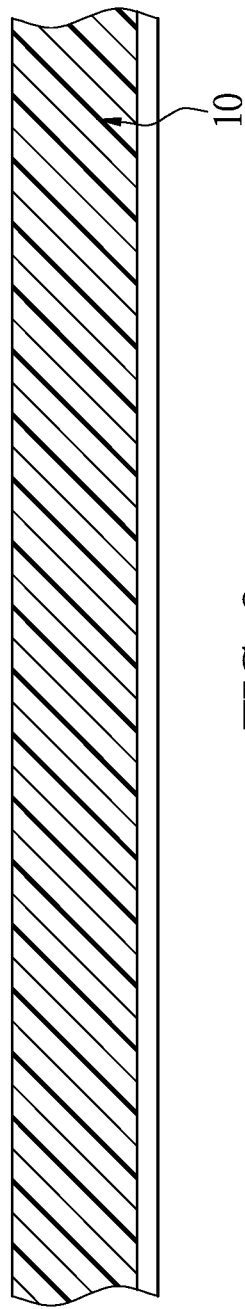

Referring first to FIG. 9, in the method according to certain embodiments of the present disclosure, the package substrate 10 is first provided (step S100). As described above, the package structure 1 formed from the package substrate 10 may be a phosphor sheet containing the wavelength conversion material 16 dispersed in the package body 15. Therefore, in certain embodiments, the package substrate 10 may be a phosphor sheet such as a phosphor wafer. In addition, the package substrate 10 may have a first surface and a second surface opposite to each other. The first surface and the second surface respectively correspond to the light exiting surface 11 and the rear surface 12 of the package structure 1 that are subsequently formed.

Figure 10:
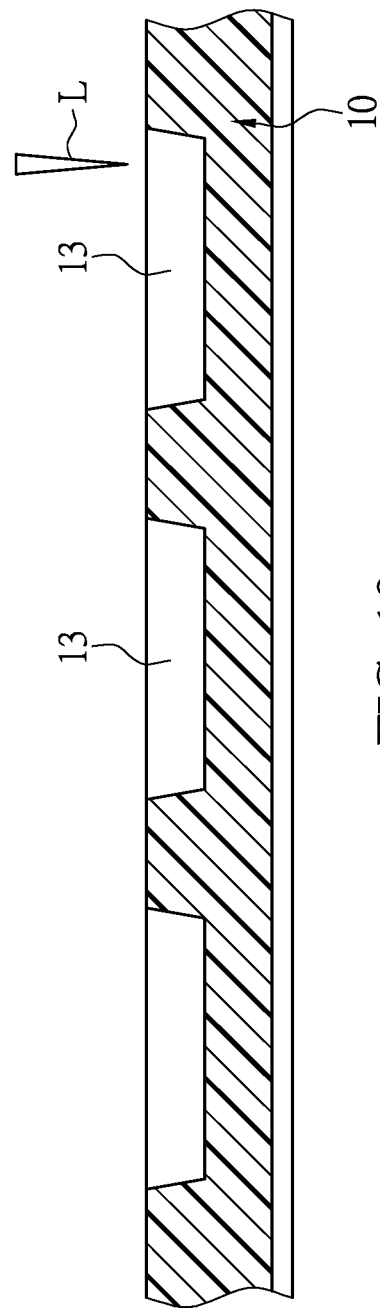

Next, reference is made to FIG. 10. In step S102, a plurality of grooves 13 recessed inwardly from the second surface of the package substrate 10 are formed. The manner in which the groove 13 is formed is not limited. For example, the grooves 13 may be formed by at least one technique of wet etching, laser etching, and plasma etching. For example, with laser etching being used as an example in FIG. 10, FIG. 10 shows that a plurality of grooves 13 are formed by cutting by a laser beam L. Using laser etching to form the grooves 13 has advantages including high accuracy and precise size (structure) control for the formation of the grooves 13.

Figure 18:
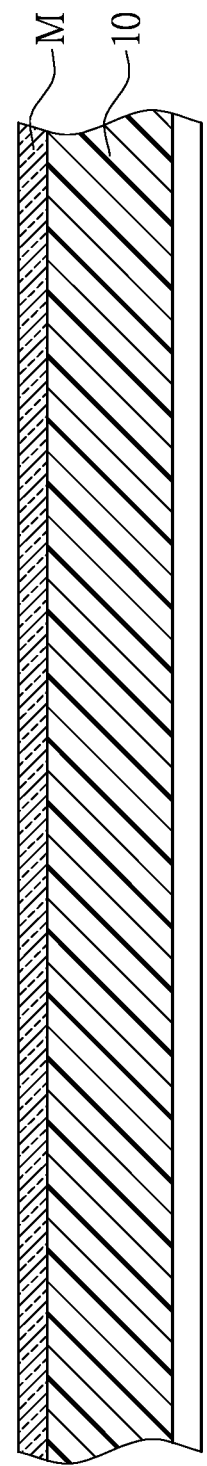
FIG. 18 is a schematic diagram of another executing manner of the step S102 of the manufacturing method for the light-emitting device according to certain embodiments of the present disclosure.
Figure 19:
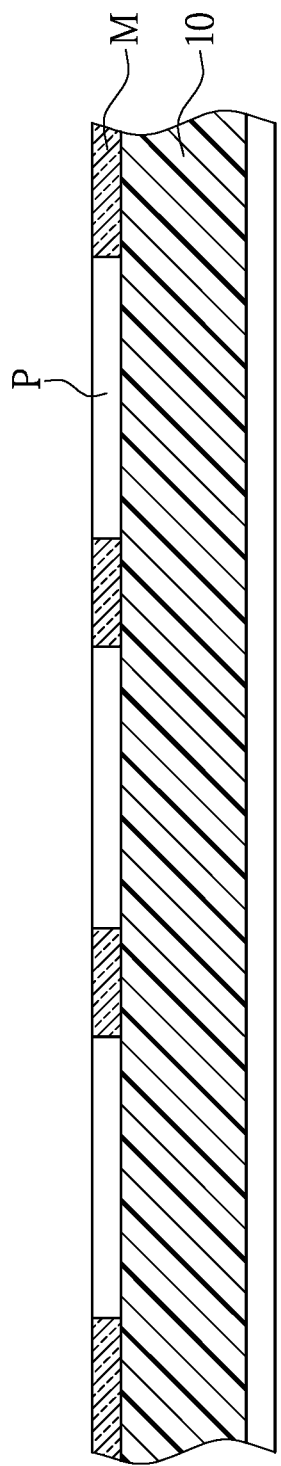
FIG. 19 is a schematic diagram of yet another executing manner of the step S102 of the manufacturing method for the light-emitting device according to certain embodiments of the present disclosure.
Figure 20:
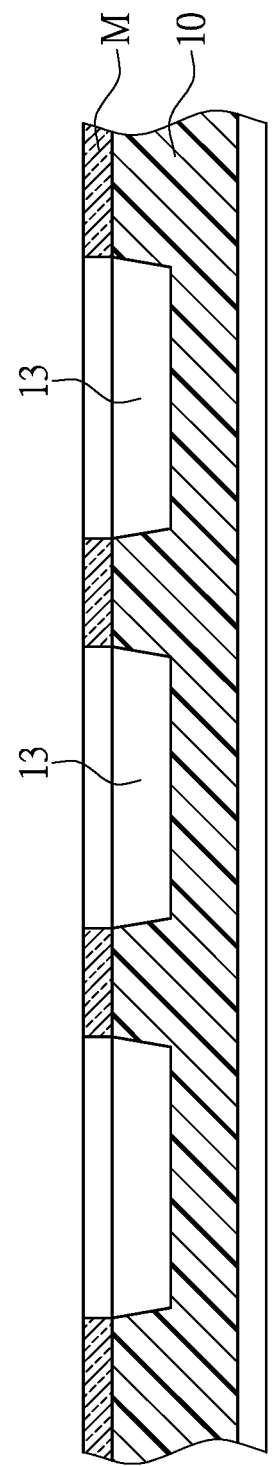
FIG. 20 is a schematic diagram of still another executing manner of the step S102 of the manufacturing method for the light-emitting device according to certain embodiments of the present disclosure.

Further, reference is made to FIG. 18 to FIG. 20, which show another execution manner of step S102 of the manufacturing method provided by the present disclosure. FIG. 18 to FIG. 20 are schematic diagrams of forming the groove 13 by wet etching or plasma etching. As shown in FIG. 18, a shield M may be first provided on the package substrate 10.

Next, as shown in FIG. 19, a pattern P is formed on the shield M, for example, removing a part of the shield M to form a hollowed pattern P. Finally, as shown in FIG. 20, a portion of the package substrate 10 under the pattern P is etched to form a groove 13.

Figure 17:
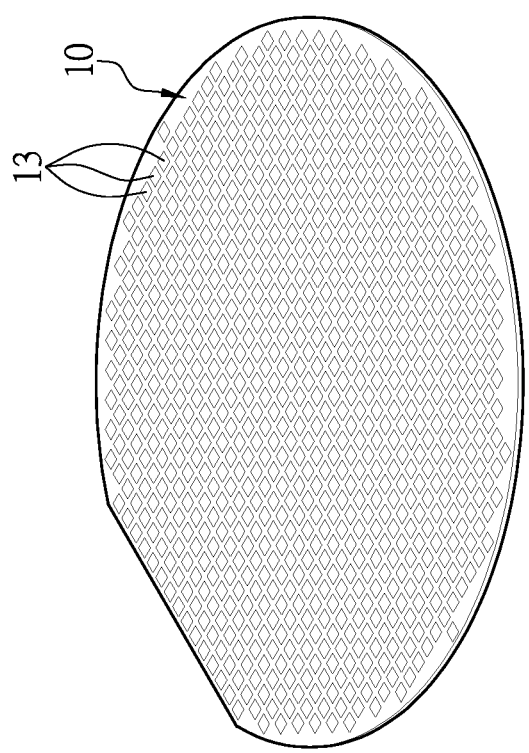
FIG. 17 is a perspective view of a structure formed by the step(s) shown in FIG. 10.

Reference is made to FIG. 17, which is a perspective view showing the structure formed by the step S102. As shown in FIG. 17, after the etching process, the package substrate 10 (e.g., phosphor wafer) has a plurality of grooves 13 on its surface.

Reference is made again to FIG. 2. The light-emitting chip 2 to be disposed in the groove 13 has at least one side surface 21. The groove 3 formed in step S102 has an inner surrounding side wall 133, and the inner surrounding side wall 133 is inclined by a second angle θ2 between 10 degrees and 30 degrees with respect to the side surface(s) 21 of the light-emitting chip 2. In other words, in the manufacturing method provided by the present disclosure, the etching method employed in step S102 may be designed in such a way that the formed groove 13 and the light-emitting chip 2 disposed subsequently therein coordinate with each other to improve light extraction efficiency.

Figure 11:
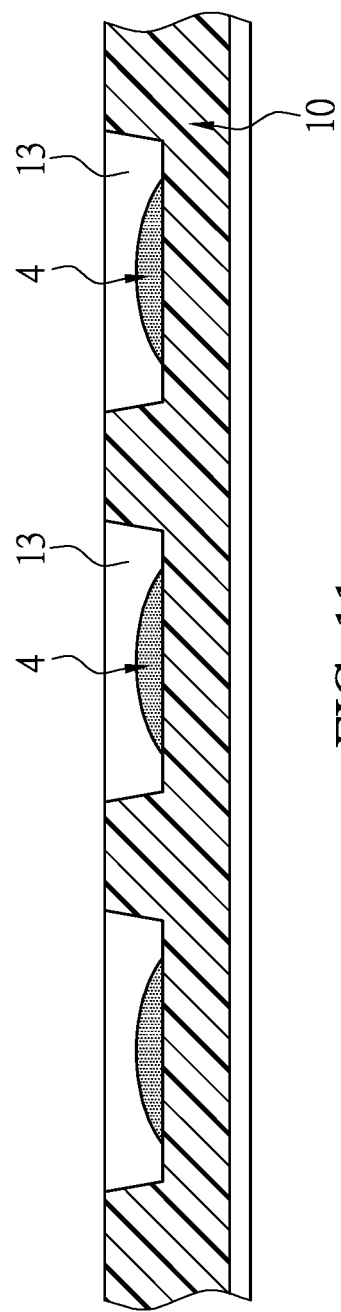

Next, reference is made to FIG. 11. In step S103, the adhesive material 4 is filled in the plurality of grooves 13. As described above, the adhesive material 4 is used to fix the light-emitting chip 2 in the groove 13 and affects the optical paths of the light emitted by the light-emitting chip 2. As shown in FIG. 11, the adhesive material 4 can be placed (e.g., dispensed) at the bottom of the groove 13. The type of the adhesive material 4 used in the step S103 is described above.

Figure 12:
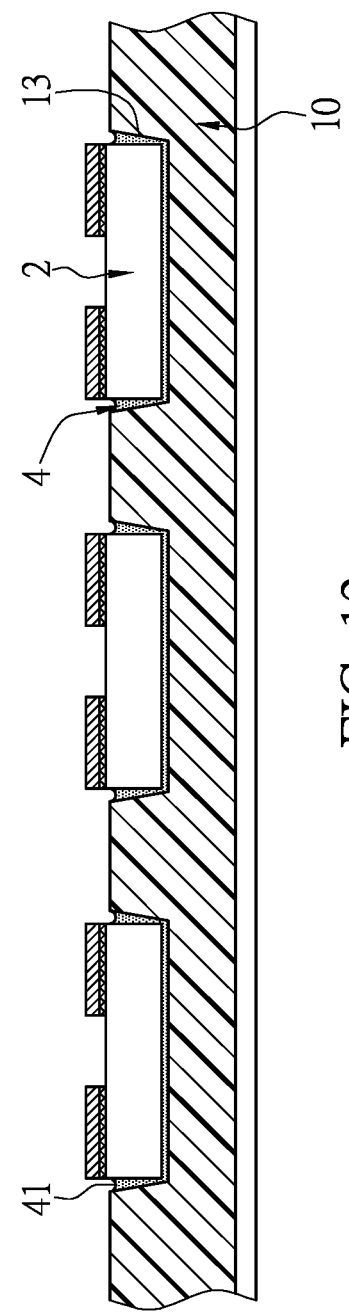

Referring to FIG. 12, in step S104, a plurality of light-emitting chips 2 are respectively disposed in the plurality of grooves 13. A light-emitting chip 2 is disposed in each of the grooves 13, and the disposition of the light-emitting chip 2 makes the adhesive material 4 to be filled between the light-emitting chip 2 and the inner surrounding side wall 133 of the groove 13. As described above, due to the characteristics of the adhesive material 4, a portion of the adhesive material 4 disposed between the light-emitting chip 2 and the inner surrounding side wall 133 of the groove 13 has a concave surface 41 recessed inwardly.

Next, as shown in FIG. 13, the second surface of the package substrate 10 is cut in step S106 to form a plurality of package structures 1 respectively corresponding to the plurality of light-emitting chips 2. For example, in certain embodiments, step S106 may include cutting the package substrate 10 by a blade K arranged in a predetermined angle. Referring also to FIG. 2, after forming a plurality of package structures 1 by cutting in step S104, each package structure 1 will have an outer surrounding side wall 14, and the outer surrounding side walls 14 may be inclined relative to the side surface 21 of the light-emitting chip 2 by a first angle θ1 between 15 degrees and 45 degrees.

As described above, based on the described predetermined structural design, the predetermined angle of the blade K for cutting the package substrate 10 in step S106 may be between 30 degrees and 90 degrees, and in certain embodiments, the outer surrounding side wall 14 formed by the cutting of the blade K is inclined relative to at least one side surface 21 of the light-emitting chip 2 by a first angle θ1 that is half of the predetermined angle. In other words, the predetermined angle may be 2×θ1 degrees. However, as long as the package structure 1 having the above structure can be obtained, the type and material of the blade K are not limited in the present disclosure.

Next, as shown in FIG. 14, in step S108, the substrate 5 is provided, and each of the light-emitting chips 2 is electrically connected to the substrate 5 through a pair of conductive pads 22. As described above, the two conductive pads 22 of the light-emitting chip 2 may be disposed outside of the groove 13 such that the light-emitting chip 2 can be electrically connected to other electronic components through the conductive pads 22 and the substrate 5. As shown in FIG. 14, the substrate 5 is electrically connected to the conductive pads 22 of the light-emitting chip 2 through the conductive lines 51 thereon. For example, in certain embodiments of the present disclosure, eutectic bonding or reflow soldering may be employed to connect the light-emitting chip 2 and the substrate 5 through the conductive pads 22 formed of a solder material.

Figure 15:
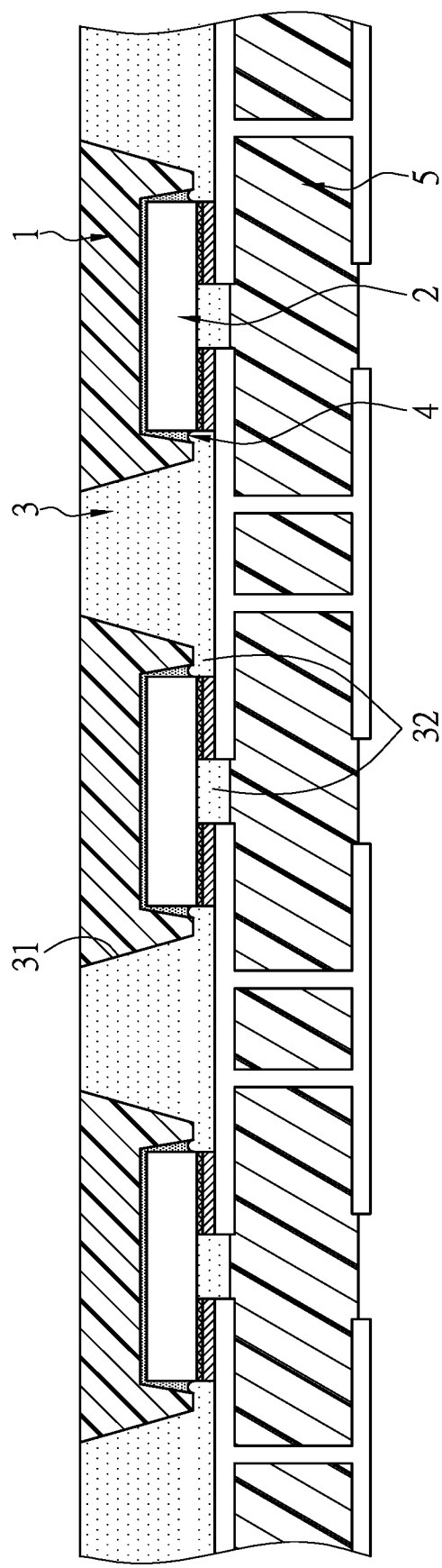

Reference is made to FIG. 15. In the manufacturing method provided by the present disclosure, a step of forming the reflective structure 3 may be further included (step S110). Specifically, in step S110, the package structure 1 may be surroundingly wrapped by a reflective material, with the light exiting surface 11 of the package structure 1 being left exposed, and the formed reflective structure 3 is formed with a reflecting surface 31 connected with the outer surrounding side wall 14 of the package structure 1. At the same time, the gaps between the bottom of the package structure 1 and the substrate 5 and between the light-emitting chip 2 and the substrate 5 are immersed with the reflective material to form the reflective structure 3 and to form a bottom reflective layer 32.

Figure 16:
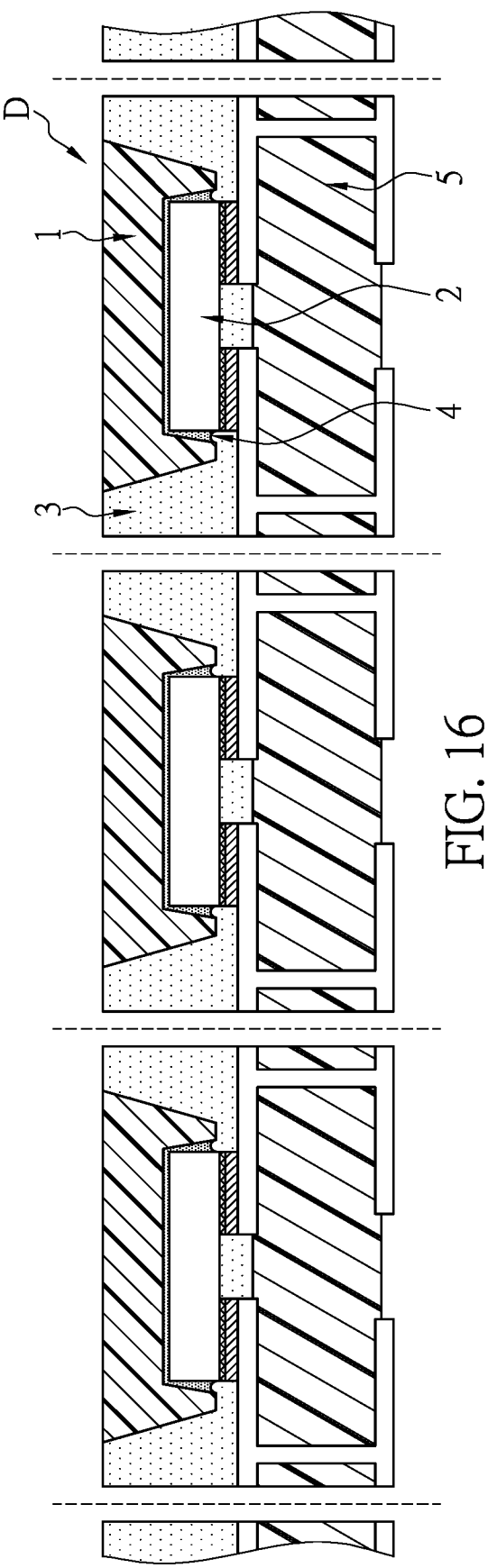
FIG. 16 is a schematic diagram of a step of the manufacturing method for the light-emitting device according to certain embodiments of the present disclosure.

Finally, as shown in FIG. 16, after the reflective structure 3 is formed, the reflective structure 3 and the substrate 5 may be cut, so as to form a plurality of light-emitting devices D by singulation. The apparatus and technical means for cutting the reflective structure 3 and the substrate 5 are not limited in the present disclosure.

Through the structural design of the package structure 1, the brightness of the light-emitting device D can be effectively improved. For example, compared to a conventional structure, that is, a side adjacent to a side surface of a light-emitting chip is not provided with a package structure having a wavelength conversion effect (hereinafter referred to as a "one-facet structure"), the design that "the width W1 of the package structure 1 gradually decreases from the light exiting surface 11 toward the rear surface 12, and the width W13 of the groove 13 gradually increases from the inside to the outside," as provided by certain embodiments of the light-emitting device D of the present disclosure, can increase the brightness of the light-emitting device D by around 14%.

Specifically, measuring the brightness produced by the conventional one-facet structure and the light-emitting device D provided by the present disclosure by a luminous flux measuring device shows that compared to a conventional one-facet structure, the light-emitting device D provided by the present disclosure increases the brightness by 1.39 to 13.77%. Specifically, compared with the conventional one-facet structure, the light-emitting device D provided by the present disclosure has a larger light-emitting area, and enhances the light extraction effect by the design of the package structure 1 (for example, the structure and size of the groove 13).

Further, aging tests were performed on both the conventional one-facet structure and the light-emitting device D provided by the present disclosure. The test results demonstrate that the light-emitting device D can maintain a satisfactory luminous flux (smaller light decay), and therefore has better reliability under the high temperature conditions (85° C./700 mA) and high temperature/high humidity conditions (85° C./85%/350 mA), as compared to the conventional one-facet structure.

Therefore, the light-emitting device D and the manufacturing method thereof can increase light extraction efficiency through the design of the width W1 of the package structure 1 gradually decreasing from the light exiting surface 11 toward the rear surface 12, and the width W13 of the groove 13 gradually increasing from the inside to the outside of the groove 13.

Specifically, the light-emitting device D provided by the present disclosure greatly improves the efficiency of the light extraction on the light exiting surface 11 for the light emitted by the light-emitting chip 2 through the shape and size design of the package structure 1 in the light-emitting device D. In addition, the design of the first angle θ1 between the outer surrounding side wall 14 of the package structure 1 and the side surface(s) 21 of the light-emitting chip 2 and the second angle θ2 between the inner surrounding side wall 133 of the groove 13 and the side surface(s) 21 of the light-emitting chip 2 further optimizes the light extraction efficiency. In addition, the light-emitting device D provided by the present disclosure also has excellent reliability, that is, having less light decay in a more severe using environment.

The foregoing description of the exemplary embodiments of the present disclosure has been presented only for the purposes of illustration and description and is not intended to be exhaustive or to limit the present disclosure to the precise forms disclosed. Many modifications and variations are possible in light of the above teaching.

Certain embodiments were chosen and described in order to explain the principles of the present disclosure and their practical application so as to enable others skilled in the art to utilize the present disclosure and various embodiments and with various modifications as are suited to the particular use contemplated. Alternative embodiments will become apparent to those skilled in the art to which the present disclosure pertains without departing from its spirit and scope.

What is claimed is:

1. A light-emitting device, comprising:
 a package structure having
  a light exiting surface;
  a rear surface facing away from the light exiting surface;
  a groove inwardly recessed from the rear surface; and
  an outer surrounding side wall surrounding the groove; and
 a light-emitting chip disposed in the groove and having at least one side surface,
 wherein a width of the package structure gradually decreases from the light exiting surface to the rear surface, and a width of the groove gradually increases along a direction away from a bottom surface of the groove;
 wherein the groove has an inner surrounding side wall that is inclined relative to the at least one side surface by an angle between 10 degrees and 30 degrees.

2. The light-emitting device according to claim 1, wherein the outer surrounding side wall is inclined relative to the at least one side surface by an angle between 15 degrees and 45 degrees.

3. The light-emitting device according to claim 1, further comprising a reflective structure surroundingly wrapping the package structure, exposing the light exiting surface and having a reflective surface connected with the outer surrounding side wall of the package structure.

4. The light-emitting device according to claim 1, wherein the groove has a groove depth, the light-emitting chip has a chip height, and the groove depth is equal to or smaller than the chip height; and wherein the light-emitting chip has at least two conductive pads disposed opposite to the light exiting surface, and the two conductive pads are exposed out of the package structure.

5. The light-emitting device according to claim 1, further comprising an adhesive material disposed in the groove, connected between the light-emitting chip and the package structure and having a refractive index between 1.39 and 1.57.

6. The light-emitting device according to claim 4, wherein a portion of the adhesive material is disposed between the at least one side surface of the light-emitting chip and the groove of the package structure has an inward recessed concave surface.

7. The light-emitting device according to claim 1, wherein the bottom surface of the groove has a first side recessed region and a second side recessed region both adjacent to an inner surrounding side wall of the groove.

8. The light-emitting device according to claim 1, wherein the package structure further comprises a package body and a wavelength conversion material dispersed in the package body.

9. The light-emitting device according to claim 1, wherein a bottom surface width of the bottom surface of the groove is 0-200 micrometers greater than a chip width of the light-emitting chip, a width of the light exiting surface is 200-600 micrometers greater than the chip width, and a width of the rear surface is 0-300 micrometers greater than the chip width.

* * * * *